United States Patent
van Iersel et al.

(10) Patent No.: US 9,825,028 B2
(45) Date of Patent: Nov. 21, 2017

(54) ULTRA LINEAR HIGH VOLTAGE RESISTORS

(71) Applicant: NXP B.V., Eindhoven (NL)

(72) Inventors: Hendrikus van Iersel, Wijchen (NL); Mattheus Johan Koerts, Arnhem (NL)

(73) Assignee: NXP B.V., Eindhoven (NL)

( * ) Notice: Subject to any disclaimer, the term of this patent is extended or adjusted under 35 U.S.C. 154(b) by 149 days.

(21) Appl. No.: 14/591,087

(22) Filed: Jan. 7, 2015

(65) Prior Publication Data

US 2016/0197592 A1   Jul. 7, 2016

(51) Int. Cl.
| | |
|---|---|
| H01L 27/08 | (2006.01) |
| H03M 1/06 | (2006.01) |
| H01L 49/02 | (2006.01) |
| H03M 1/12 | (2006.01) |

(52) U.S. Cl.
CPC .......... *H01L 27/0802* (2013.01); *H01L 28/20* (2013.01); *H03M 1/0614* (2013.01); *H03M 1/12* (2013.01)

(58) Field of Classification Search
CPC .. H01L 27/0802; H01L 27/0738; H01L 28/20
USPC .......................................... 257/536, 538, 543
See application file for complete search history.

(56) References Cited

U.S. PATENT DOCUMENTS

| | | | |
|---|---|---|---|
| 4,164,668 A | 8/1979 | Delaporte | |
| 6,291,306 B1 | 9/2001 | Hsu | |
| 8,624,322 B1* | 1/2014 | Su | H01L 27/0629 257/359 |
| 8,716,827 B2 | 5/2014 | Benaissa | |
| 2001/0041412 A1* | 11/2001 | Takasu | H01L 27/0629 438/381 |
| 2004/0070050 A1* | 4/2004 | Chi | H01L 27/0802 257/536 |
| 2005/0212083 A1* | 9/2005 | Chi | H01L 27/0802 257/536 |
| 2006/0118908 A1* | 6/2006 | Erickson | H01L 28/20 257/536 |
| 2006/0234439 A1* | 10/2006 | Howard | H01L 28/20 438/238 |
| 2010/0109775 A1* | 5/2010 | Kamakura | H01L 27/0802 330/260 |
| 2012/0056303 A1* | 3/2012 | Cho | H01L 27/0802 257/536 |
| 2012/0132997 A1 | 5/2012 | Tokita | |
| 2012/0292740 A1* | 11/2012 | Lin | H01L 28/20 257/536 |

(Continued)

OTHER PUBLICATIONS

Chuang, Hung-Ming, et al.; "A comprehensive study of polysilicon resistors for CMOS ULSI applications"; Superlattices and Microstructures, Academic Press, London, GB, vol. 33, No. 4; pp. 193-208; (Apr. 1, 2003).

(Continued)

*Primary Examiner* — David Ton (57) ABSTRACT

Some embodiments include a resistor that may be used in audio conversion for an ADC. The resistor may be made up of an n-well as well as a p-well polysilicons. The n-well and p-well polysilicons may include a shallow trench isolator. The n-well and p-well components may be in series with other n-well or p-well components respectively. Similarly, multiple n-well components which are in series, may be in parallel with multiple p-well components.

16 Claims, 7 Drawing Sheets

(56) References Cited

U.S. PATENT DOCUMENTS

2013/0032862 A1\* 2/2013 Su ..................... H01L 27/0802
257/272
2015/0341046 A1\* 11/2015 Schinkel ............... H03M 3/446
330/69

OTHER PUBLICATIONS

Extended European Search Report for Patent Appln. No. 15201893.3 (dated Sep. 28, 2016).
Tuinhout, et al., "Design and Characterization of a High-Precision Resistor Ladder Test Structure", Semiconductor Manufacturing, IEEE Transactions on 16.2 (2003), 187-193.

\* cited by examiner

ULTRA LINEAR HIGH VOLTAGE RESISTORS

TECHNICAL FIELD

Various exemplary embodiments disclosed herein relate generally to electronic circuits, and more specifically to semiconductor resistors.

BACKGROUND

A digital amplifier may include an integrated power audio amplifier with feedback behind the inductor-Capacitor-filter (LC-filter) where the output is converted from analog to digital such that the signal processing such as amplification and feedback control may be done in the digital domain.

Audio amplifiers and systems are known for large voltage swings as audio volumes and amplitudes go up and down with the audio signal. Similarly, audio listeners may frequently and easily detect distorted or poor audio variations when sound is not reproduced very accurately.

SUMMARY

A brief summary of various exemplary embodiments is presented. Some simplifications and omissions may be made in the following summary, which is intended to highlight and introduce some aspects of the various exemplary embodiments, but not to limit the scope of the embodiments. Detailed descriptions of a preferred exemplary embodiment adequate to allow those of ordinary skill in the art to make and use the inventive concepts will follow in later sections.

Various exemplary embodiments relate to a resistor comprising: a poly resistor on n-well where the poly resistor is electrically isolated from the n-well by shallow trench isolation; and coupled in parallel; a poly resistor on p-well where the poly resistor is electrically isolated from the p-well by shallow trench isolation, wherein the n-well and p-well are biased oppositely.

The resistor may create a linear voltage output.

The resistor may include a circuit made up one or more poly resistors on n-well connected in series in parallel with the same amount poly resistors on p-well connected in series The resistor may be made using a poly-Silicon substrate.

The resistor may be used in an audio sigma delta conversion process.

The resistor may be biased at a positive voltage compared to the voltage over the resistor.

The resistor may be made up of two poly resistors on n-well connected in series in parallel with two poly resistors on p-well connected in series.

The resistor may be connected to a low-latency analog-to-digital converter.

The resistor may be 12 um wide.

The resistor may have the width of the poly resistor on n-well is at least 5 um and the width of the poly resistor on p-well is at least 5 um.

BRIEF DESCRIPTION OF THE DRAWINGS

In order to better understand various exemplary embodiments, reference is made to the accompanying drawings, wherein.

2

To facilitate understanding, identical reference numerals have been used to designate elements having substantially the same or similar structure or substantially the same or similar function.

DETAILED DESCRIPTION

The description and drawings merely illustrate the principles of certain embodiments. It will thus be appreciated that those skilled in the art will be able to devise various arrangements that, although not explicitly described or shown herein, embody the principles of the idea and are included within its scope. Furthermore, all examples recited herein are principally intended expressly to be only for pedagogical purposes to aid the reader in understanding the principles of certain embodiments and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Embodiments may include a resistor that may be used in audio conversion for an ADC. The resistor may be made up of a poly resistor on n-well as well as a poly resistor on p-well polysilicon layers in a semiconductor device. Resistors with the n-well and p-well polysilicon layers may include a shallow trench isolator. The poly resistor on n-well and poly resistors on p-well components may be in series with other poly resistors on n-well or poly resistor on p-well components respectively. Similarly, multiple poly resistor on n-well components which are in series, may be in parallel with multiple poly resistor on p-well components. All such devices may be part of a single integrated circuit (IC).

Ultra linear resistors which can cope with 40V may be used for the analog-to-digital conversion by means of a sigma delta conversion in an audio amplifier with an output up to 40V. Embodiments of such a resistor are disclosed.

Figure 1:
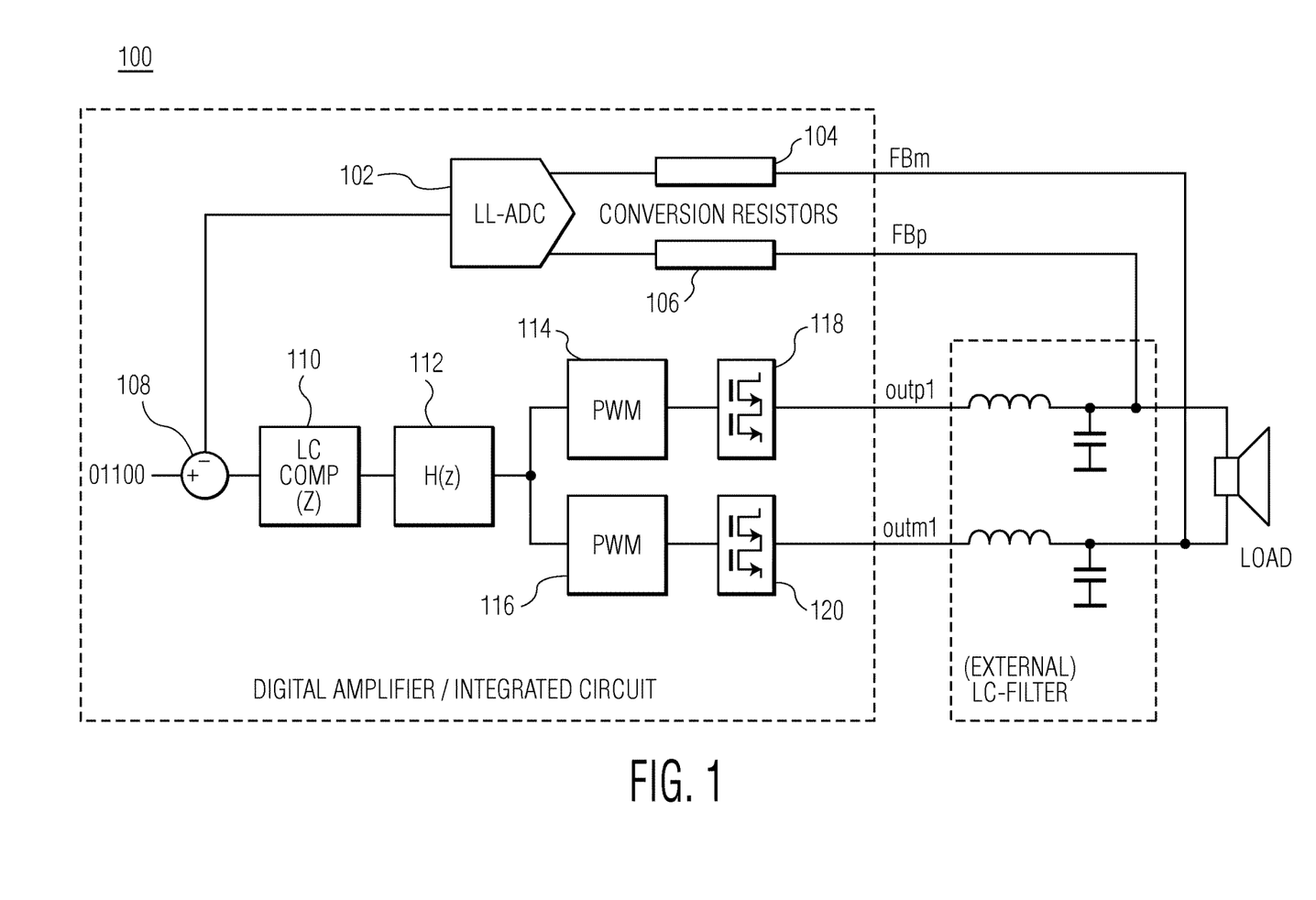
FIG. 1 illustrates an exemplary digital amplifier circuit.

FIG. 1 illustrates an exemplary digital amplifier circuit 100. Digital amplifier circuit 100 may include, low-latency analog-to-digital converter (LL-ADC) 102, conversion resistors 104, 106, error subtraction point 108, inverse LC-filter (LC compensation) 110, filter 112, pulse-width-modulators (PWM) 114, 116, and power stages, 118, 120.

Exemplary digital amplifier circuit 100 may be any kind of digital amplifier circuit, including a sound system, or a video system. In one example, exemplary digital amplifier circuit 100 may be a standalone sound system in a home, and in another example, exemplary digital amplifier circuit 100 may be an integrated sound system in a car.

The LL-ADC 102 along with conversion resistors 104, 106 may make a subsystem within digital amplifier circuit 100. The LL-ADC 102 along with conversion resistors 104, 106 may determine the noise in the system. Similarly, LL-ADC 102 along with conversion resistors 104, 106 may determine output offset and/or the total harmonic distortion (THD) of the digital amplifier circuit 100.

The LL-ADC 102 may include a tracking type ADC. LL-ADC 102 may deliver current into conversion resistors 104, 106 such that the virtual ground may stay at a reference voltage. For example, the reference voltage may be 0.8V or 0.9V. The current, therefore, may be a measure of the voltage at the amplifier output. The LL-ADC 102 may be configured using low voltage components such as, less than 1.8V, for example, in consideration of area efficiency.

Conversion resistors 104, 106 may be used for level shifting a high voltage output of the amplifier to a low voltage of the LL-ADC 102. For example, conversion resistors 104, 106 may include output voltage shifts from 6V to 40V. Similarly, LL-ADC 102 may include output voltages less than 1.8V or 2V.

The LL-ADC's 102 tracking current may be derived from a reference voltage over a reference resistor. The gain of the digital amplifier may be defined by, for example:

(Rconversion/Rreference)*factor*Vref

Mismatch between conversion resistors 104, 106 may lead to an output offset of the digital amplifier. Non linearity of conversion resistors 104, 106 may lead to harmonic distortion.

Non-linearity may not be able to be compensated by using a reference resistor regardless of whether the reference resistor is the same type, orientation, and has the same environment and temperature. Voltage swings, such as a 40V audio swing, on conversion resistors 104, 106 may vary with the signal itself, while the reference resistor may be biased at a fixed and low voltage.

A cause of non linearity of conversion resistors 104, 106 may include, voltage dependence of the resistance. Another cause of non linearity of conversion resistors 104, 106 may be self heating of the conversion resistors 104, 106. Similarly, another cause of non linearity of conversion resistors 104, 106 may include signal dependant temperature differences between the conversion resistor, 104, 106 and reference resistor.

Digital amplifier circuit 100 may prefer a THD of more than 100 dB. Similarly, digital amplifier circuit 100 may desire voltages over the conversion resistors 104, 106 with a maximum of 40V. Therefore, a resistor is desirable that lacks non-linearity, matching problems, self heating, temperature variation due to powerstages, substrate noise disturbance and voltage breakdowns. A resistor with ultra high linearity, high voltage capability, good matching characteristics and a low temperature coefficient increases the performance of the digital amplifier circuit 100. External resistors may increase costs for such a circuit as digital amplifier circuit 100, for example.

Figure 2:
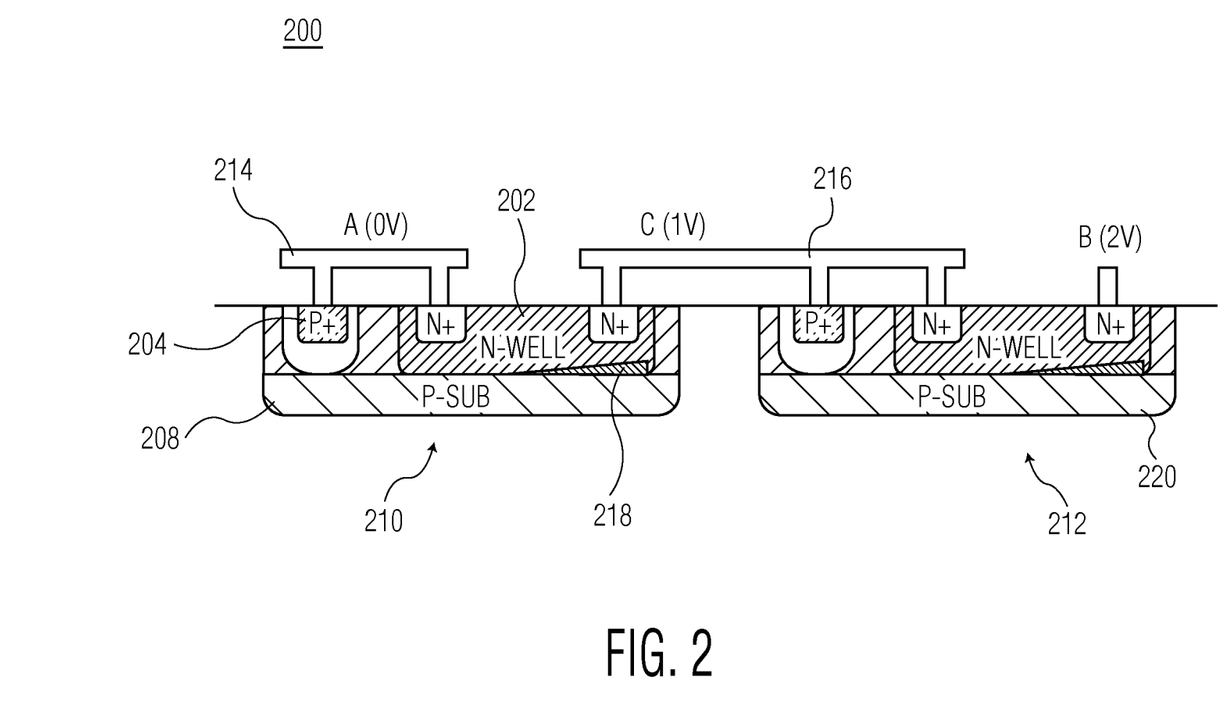
FIG. 2 illustrates an exemplary stacked n-well resistor.

FIG. 2 illustrates an exemplary resistor 200. Exemplary resistor 200 may include n-well 202, P+ contact point 204, N+ contact point 206, p-sub area 208, stacked n-well resistor 210, stacked n-well resistor 212, contact A 214, contact C 216, depletion region 218 and p-sub 220.

In exemplary stacked n-well resistor 210 a n-well 202 may be in polysilicon substrate p-sub area 208. Stacked n-well resistor 210 may have two contacts, 214 A and 216 C respectively. Contact A 214 may also be connected to the p-sub area 208. When a voltage is applied to contact C 216, a depletion region may be formed as indicated by depletion region 218. The depletion region 218 effectively may make the n-well 202 less deep and thereby more highly resistive. The resistance may be dependent on the applied voltage over the resistor. P+ contact point 204 may connect contact A 214 to p-sub area 208. Similarly, N+ contact point 206 may connect contact A 214 to n-well 202. Stacked n-well resistor 212 may be similar to stacked n-well resistor 210.

In some embodiments, a stacked n-well resistor 210 may include separate resistors on different substrates. P-sub 208 and p-sub 220 may be biased at the taps between the stacked n-well resistors 210, 212. This may reduce the voltage swing over the individual resistors, which may reduce voltage dependency.

Figure 3:
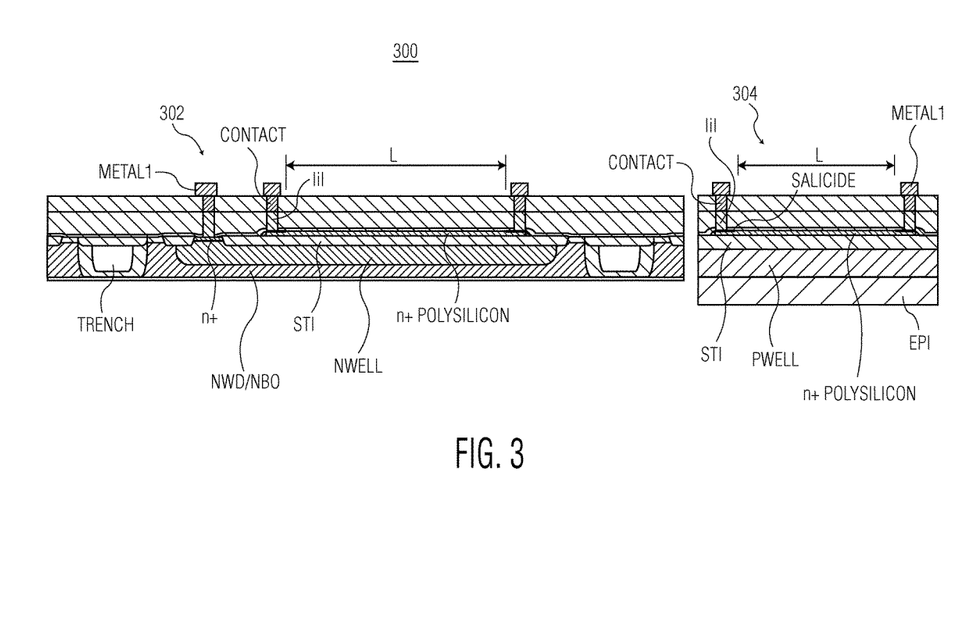
FIG. 3 illustrates an exemplary cross section of a poly resistor on n-well and a poly resistor on p-well.

FIG. 3 includes a cross section of a poly resistor on n-well and a poly resistor on p-well that may be used in certain embodiments. The resistor structure may include two stacks 302, 304 of poly resistors each on a shallow trench isolator (STI). One stack 302 may have a poly resistor on n-well under the STI. The poly resistor on n-wells of stack 302 may be biased at a positive voltage compared to the average voltage over the resistor stack. The other stack 304 may have poly resistor on p-well under the STI. The poly resistor on p-wells under stack 304 may be biased at a negative voltage compared to the average voltage over the resistor stack.

Figure 4:
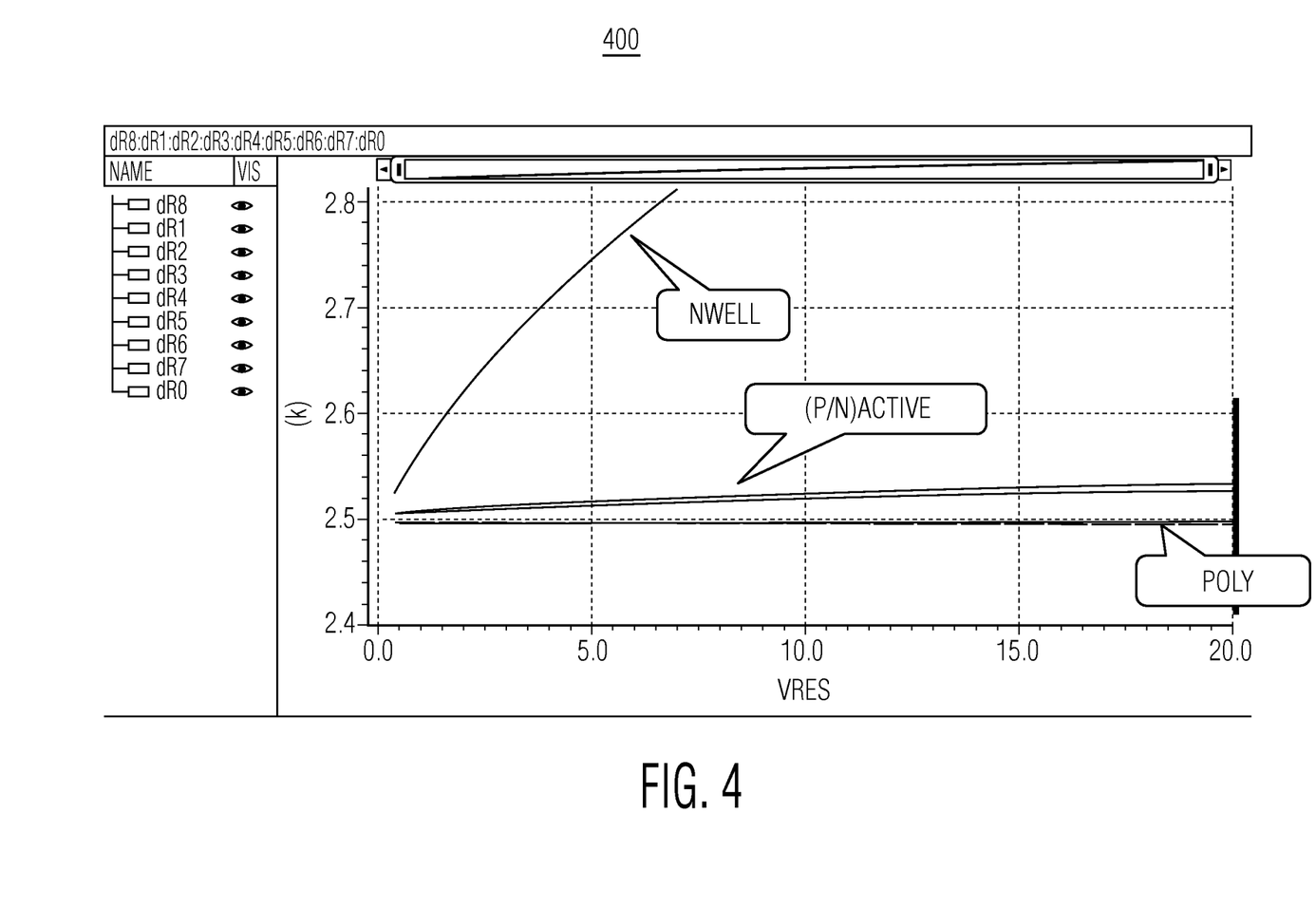
FIG. 4 illustrates exemplary resistance values.

FIG. 4 illustrates exemplary resistance values 400. Exemplary resistance values 400, demonstrates resistor values as a function of the applied voltage over the resistor for various resistors in the used IC technology. Exemplary resistance values 400 demonstrates that poly resistors tend to be the most linear resistors. The IC technology in which embodiments may be applied, include for example a 140 nm CMOS process completed with high voltage high power transistors on a SiO2 isolated substrate (SOI). Some of the poly resistors in this technology may be the most linear resistors available.

Two poly resistor structures may be available in the process such as n-well 302 and p-well 304. Both may be on top of a shallow trench isolator (STI) and thus are galvanic separated from the substrate/well below. Both resistors may have small voltage dependence.

The maximum allowable voltage between the poly resistor and the well beneath may be 17V above which, there may be voltage breakdown through an STI. A stack of three resistors may cope with the 40V input voltage of the converter, or output voltage of the digital amplifier. The three wells may be isolated from each other by applying sufficient lateral spacing in combination with deep trench isolation. By stacking three resistors in series the max allowable voltage may be tripled compared to a single resistor.

In a simulated resistor test using three resistors in series, a Total Harmonic Distortion (THD) of −86 dB was achieved, far below the desired 100 dB. The used device models were confirmed to model non-linearity. Results were for a poly resistor on n-well alone such as stack 302. Poly resistor on p-well, such as stack 304 performs the same. Further simulations demonstrated that 24 stacked resistors change the THD by only 4 dB. More than 200 stacked resistors result in 100 dB THD performance.

The stack of poly resistor on n-well resistors where the n-wells are biased by the voltage at the top of the individual resistors may have a small but not neglectable voltage coefficient. Each resistor in this stack may have a n-well potential which is positive compared to the average potential of the poly resistor itself. Vn-well-poly is positive. Through accumulation, such as for example more electrons in the poly, the resistance of the poly in the resistor may be reduced slightly. This reduction of the resistance may be dependent on Vn-well-poly and thus in the end may be dependent on the applied voltage over the stack. The poly resistor on n-well may have a negative voltage coefficient.

For the poly resistor on p-well a similar effect may take place. The bias of the p-well may be chosen negative as compared to the average potential of the poly resistor on top. This may be done by connecting the p-well to the bottom of the individual resistors in the stack. Vp-well-poly may be negative, which may cause depletion, or fewer electrons in the poly which may result in an increase of the poly resistance. The poly resistor on p-well may have a positive voltage coefficient.

Because both resistor types may be of the same polysilicon, such as using the same doping, for example, and may be on the same STI layer, their voltage dependency may be equal except for the sign. A parallel circuit of two stacks of both types with the above described well biasing, may cancel the residual voltage dependency. The voltage coefficient may be equal to zero.

Figure 5:
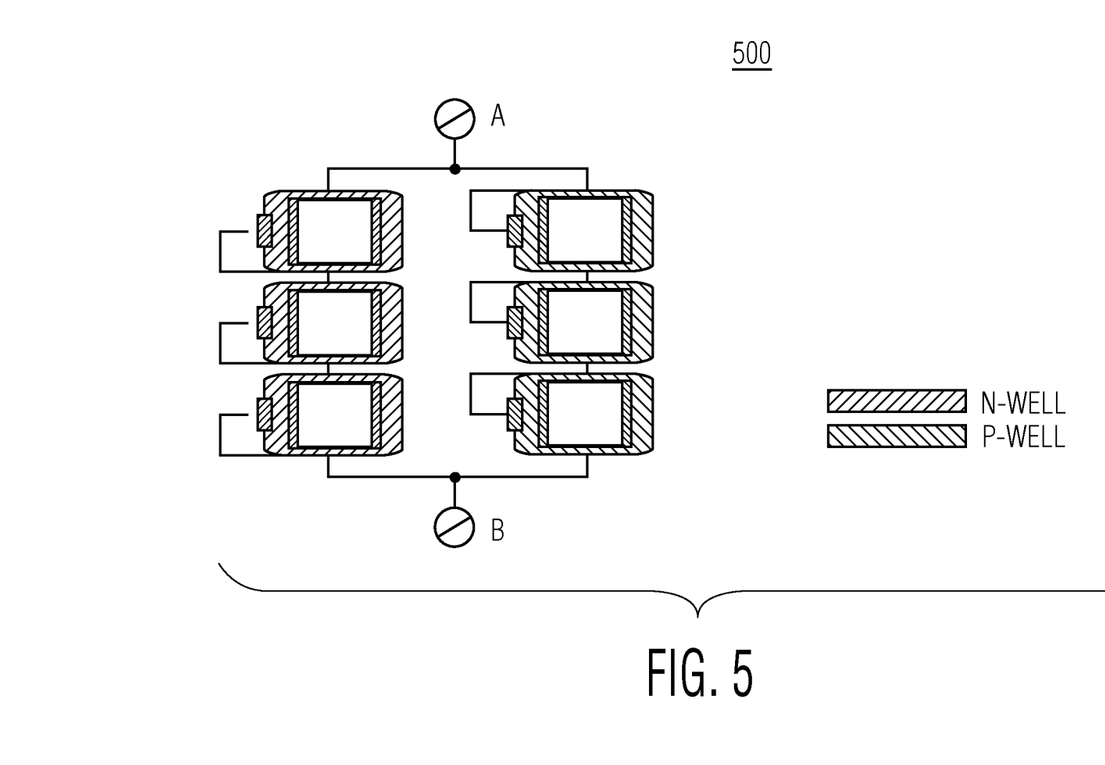
FIG. 5 illustrates an exemplary embodiment of a linear high voltage resistor.

FIG. 5 illustrates an exemplary embodiment of a linear high voltage resistor 500. An embodiment of a linear high voltage resistor's structure may include: 2 resistors, or 2 strings of resistors in parallel. The number of resistors in each string may be one, two, three etc. In an exemplary embodiment of a linear high voltage resistor 500 a stack of three is used. Both strings may be made of poly resistors on top of STI with one string, for example, with poly resistor on n-well under the STI and the other string with poly resistor on p-well under the STI. The poly resistor on n-wells may be biased by the voltage on the top of the individual resistors. The poly resistor on p-well's may similarly be biased by the voltage at the bottom of the individual resistor. The result of a circuit simulation using compact models showed the change in THD, −100 dB and −102 dB was achieved.

This cancelling of the voltage coefficient was verified with measurements on existing silicon. In this silicon, there was access to both resistor terminals, as well the n-well or p-well beneath the resistor.

Figure 6:
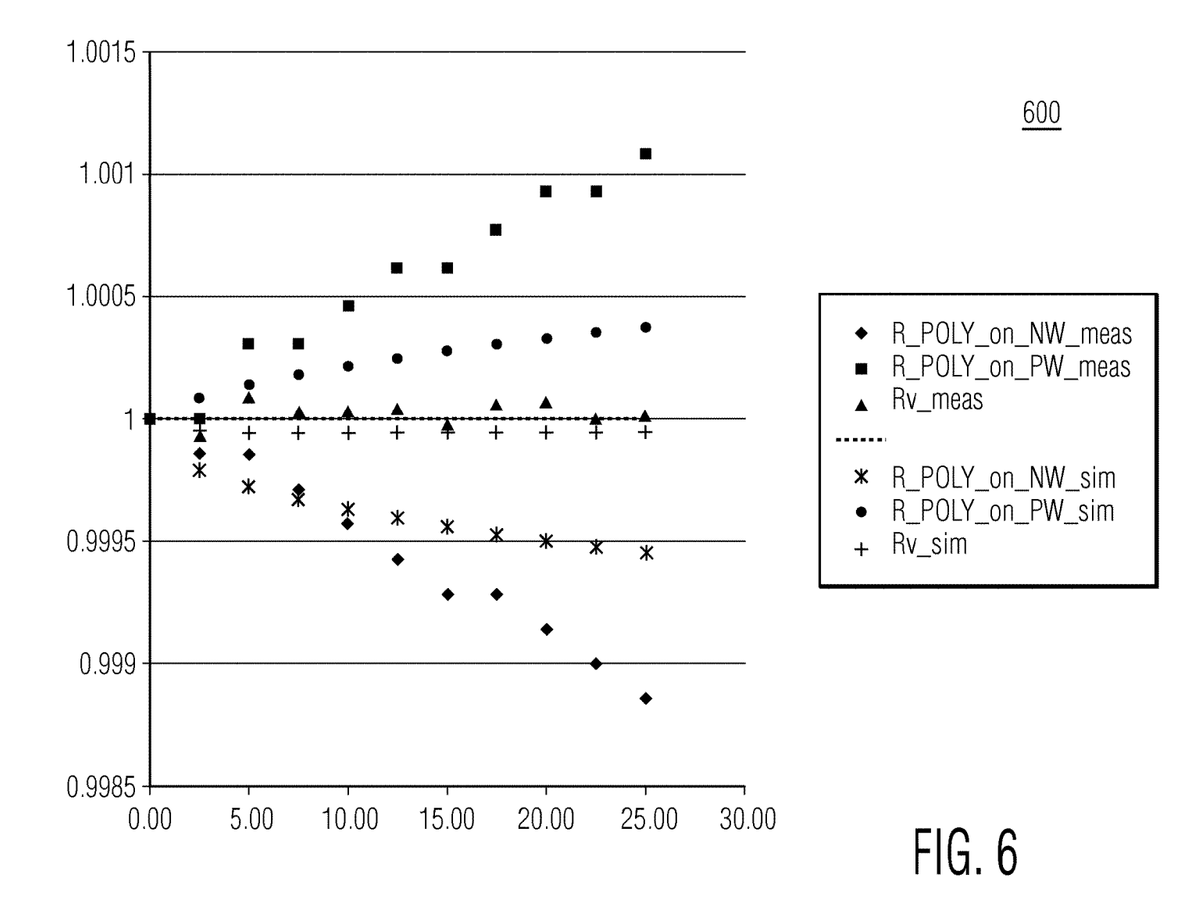
FIG. 6 illustrates measured resistance versus voltage for an embodiment of the linear high voltage resistor graph.

FIG. 6 illustrates measured resistance versus voltage for an embodiment of the linear high voltage resistor graph 600. Graph 600 demonstrates the normalized resistance versus the applied voltage over the resistor both for measured data as well the result of circuit simulations using a compact model. Also in measurements the voltage dependency of both type resistors with the appropriate well-biasing may cancel each other. This cancelling may be proven for voltages over a single resistor up to 25V. The Graph 600 also shows that the models are a bit too optimistic underlining the desire for some embodiments.

The resistors have some matching recommendations as well. The amplifier output voltage offset recommendation is Voffs<12.5 mV (1σ) when the DC output voltage is 7.2V.

$$\sigma_{\Delta R/R} = 12.5 \text{ mV/Sqrt}(2)/7.2\text{V} = 0.0012$$

The $\sigma_{\Delta R/R}$ may be dependent on the active area of the resistor and some constants belonging to the particular IC-technology.

$$\sigma_{\Delta R/R} = \sqrt{\frac{A_R^2}{R} + \left(\frac{k_{head}}{R}\right)^2}$$

$$A_R = \frac{a}{W + \Delta W}$$

$$K_{head} = \frac{k}{W + \Delta W}$$

Since the resistance may be a given, the W/L ratio may be fixed. The offset voltage may be expressed as a function of the Width of the resistor. A plot of this equation indicates a width of the resistor that is at least 10 um to satisfy the offset recommendation. Some embodiments may use 11 um, 12 um, 13 um etc. With a structure of parallel resistor strings on top of a poly resistor on n-well and a poly resistor on p-well both strings may have a minimum width of 5. The area of the complete solution may be dominated by the matching requirement. The extra spacing between the two resistor strings may only mildly increase the area for the complete resistor structure.

Under a self-heating effect, a change in resistance due to the heating up of the resistor may be caused by dissipation in the resistor from the current through, and/or the voltage over the resistor. This may be due to the temperature coefficient of the resistor. Self heating may spoil the linearity of a resistor. The poly resistor may be thermally isolated from the bulk of the IC by the STI.

Figure 7:
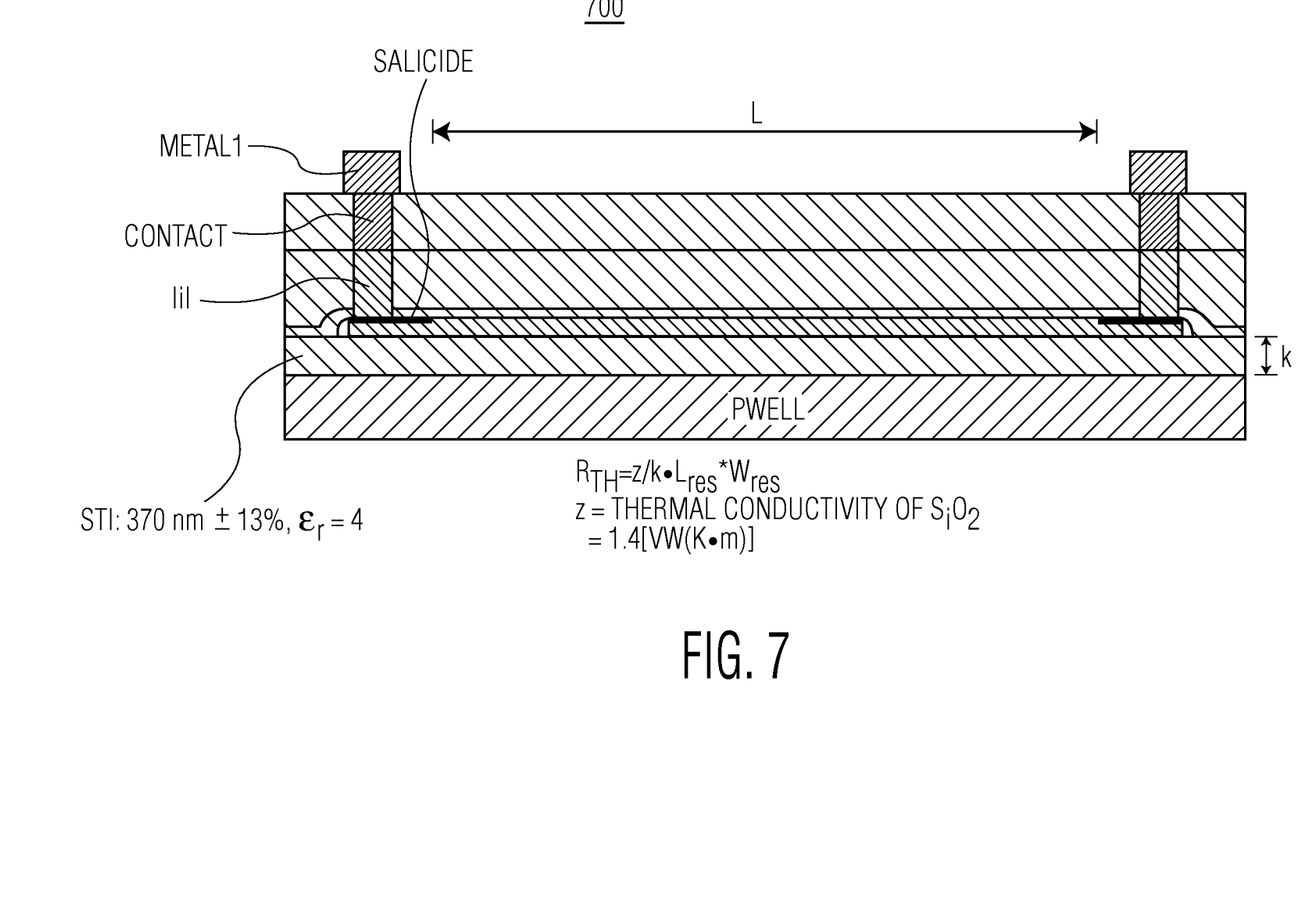
FIG. 7 illustrates an exemplary resistor using a first order thermal model.

FIG. 7 illustrates an exemplary resistor using a first order thermal model 700. A first order thermal model may be used to determinate the increase of temperature in the poly as result of dissipation in the poly. The temperature change, ΔT, is defined as:

$$\Delta T = P^* R_{TH}$$

$$\Delta T = P^*(1/Z^*(k/(L^*W))),$$

where P is a constant associated with the poly, Z is thermal conductivity of SiO2, K is the distance between n+ polysilicon and the p-well, W is the width of the resistor, L is the length of the n+ polysilicon.

The temperature rise may depend on W and L of resistor. An increase of the area of the resistor may reduce the self-heating effect. For example, if $$W=12,$$

$$\Delta T = (14.42/5200)^*1/1.4^*(375 \text{ nm}/(12u^*(3^*160 \text{ um})),$$
and $$\Delta T = 1.8° \text{ C.,}$$

then this temperature increase leads to a change in resistance, ΔR, via the temperature coefficient of the poly, TC1, as follows:

$$\Delta R = \Delta T^* TC1$$

$$\Delta R = 1.8^*1.1e-4$$

$$\Delta R = 0.00020,$$

The resistors with, for example, W=12 um, are already large enough not to suffer too much from the self heating effect.

Although the various exemplary embodiments have been described in detail with particular reference to certain exemplary aspects thereof, it should be understood that the idea is capable of other embodiments and its details are capable of modifications in various obvious respects. As is readily apparent to those skilled in the art, variations and modifications can be affected while remaining within the spirit and scope of the embodiments. Accordingly, the foregoing disclosure, description, and figures are for illustrative purposes only and do not in any way limit the invention, which is defined only by the claims.

What is claimed is:

1. A resistor comprising:
   a poly resistor on n-well connected to a first shallow trench isolator, wherein the poly resistor on the n-well is configured to be biased at a positive voltage compared to an average voltage over a resistor stack; and a poly resistor on p-well connected in parallel to a second shallow trench isolator, wherein the poly resistor on the p-well is configured to be biased at a negative voltage compared to the average voltage over the resistor stack.

2. The resistor of claim 1, wherein the resistor creates a linear voltage output.

3. The resistor of claim 1, wherein a resistor circuit is made up of three poly resistors on n-well connected in series in parallel with three poly resistors on p-well connected in series.

4. The resistor of claim 1, wherein the resistor is made using a poly-Silicon substrate.

5. The resistor of claim 1, wherein the resistor is used in an audio sigma delta conversion process.

6. The resistor of claim 1, wherein a resistor circuit is made up of two poly resistors on n-well connected in series in parallel with two poly resistors on p-well connected in series.

7. The resistor of claim 1, wherein the resistor is connected to a low-latency analog to digital converter.

8. The resistor of claim 1, wherein the width of the resistor is at least 10 um.

9. The resistor of claim 1, wherein the poly resistor on n-well is biased at the top of the resistor, and the poly resistor on p-well is biased at the top of the resistor.

10. An audio system comprising:
an analog-to-digital converter (ADC);
a resistor connected to the ADC requiring and comprising:
 a poly resistor on n-well connected to a first shallow trench isolator, wherein the poly resistor on the n-well is configured to be biased at a positive voltage compared to an average voltage over a resistor stack, and
 a poly resistor on p-well connected in parallel to a second shallow trench isolator, wherein the poly resistor on the p-well is configured to be biased at a negative voltage compared to the average voltage over the resistor stack; and
a digital amplifier connected to the ADC.

11. The audio system of claim 10, wherein the resistor creates a linear voltage output.

12. The audio system of claim 10, wherein a resistor circuit is made up of three poly resistors on n-well connected in series in parallel with three poly resistors on p-well connected in series.

13. The audio system of claim 10, wherein a resistor circuit is made up of two poly resistors on n-well connected in series in parallel with two poly resistors on p-well connected in series.

14. An analog-to-digital converter comprising:
a low-latency analog-to-digital converter (LL-ADC), wherein the LL-ADC outputs current into a resistor requiring and comprising:
 a poly resistor on n-well connected to a first shallow trench isolator, wherein the poly resistor on the n-well is configured to be biased at a positive voltage compared to an average voltage over a resistor stack; and
 a poly resistor on p-well connected in parallel to a second shallow trench isolator, wherein the poly resistor on the p-well is biased at a negative voltage compared to the average voltage over the resistor stack.

15. The analog-to-digital converter of claim 14, wherein the LL-ADC is configured using low voltage components.

16. The analog-to-digital converter of claim 14, wherein a resistor circuit is made up of three poly resistors on n-well connected in series in parallel with three poly resistors on p-well connected in series.

* * * * *